(12) United States Patent
Nakano et al.

(10) Patent No.: US 10,114,910 B2
(45) Date of Patent: Oct. 30, 2018

(54) THREE-DIMENSIONAL MODEL GENERATING DEVICE, METHOD OF DETERMINING STRUCTURAL MEMBER, AND PROGRAM

(71) Applicants: HITACHI, LTD., Tokyo (JP); COMPUTER AND AUTOMATION RESEARCH INSTITUTE, HUNGARIAN ACADEMY OF SCIENCES, Budapest (HU)

(72) Inventors: Takahiro Nakano, Tokyo (JP); Youichi Nonaka, Tokyo (JP); Gabor Erdos, Budapest (HU); Jozsef Vancza, Budapest (HU); Laszlo Monostori, Budapest (HU)

(73) Assignees: HITACHI, LTD., Tokyo (JP); COMPUTER AND AUTOMATION RESEARCH INSTITUTE, HUNGARIAN ACADEMY OF SCIENCES, Budapest (HU)

( * ) Notice: Subject to any disclaimer, the term of this patent is extended or adjusted under 35 U.S.C. 154(b) by 268 days.

(21) Appl. No.: 15/183,211

(22) Filed: Jun. 15, 2016

(65) Prior Publication Data
US 2016/0371399 A1 Dec. 22, 2016

(30) Foreign Application Priority Data
Jun. 16, 2015 (JP) ................................ 2015-120758

(51) Int. Cl.
*G06F 17/50* (2006.01)

(52) U.S. Cl.
CPC .................................... *G06F 17/50* (2013.01)

(58) Field of Classification Search
None
See application file for complete search history.

(56) References Cited

U.S. PATENT DOCUMENTS

| 5,442,569 A | * | 8/1995 | Osano | G06F 17/12 |
| | | | | 716/107 |
| 2014/0081602 A1 | * | 3/2014 | Asamizu | G06T 19/20 |
| | | | | 703/1 |

FOREIGN PATENT DOCUMENTS

JP 2014-109555 A 6/2014

* cited by examiner

*Primary Examiner* — Craig C Dorais
(74) *Attorney, Agent, or Firm* — Volpe and Koenig, P.C.

(57) ABSTRACT

In order to automatically determine a structural member that is included in a structure and has flat surfaces, an input unit is configured to input three-dimensional point group data of the structure, a flat surface extraction unit is configured to extract the flat surfaces of the structure based on the three-dimensional point group data, a grouping unit is configured to group the flat surfaces into flat surface groups based on an angle of each of the flat surfaces with respect to a reference direction and a distance between the flat surfaces, a connection relationship extraction unit is configured to extract a connection relationship between the grouped flat surface groups, and a determination unit is configured to determine the structural member that the structure is constructed from based on the extracted connection relationship.

8 Claims, 17 Drawing Sheets

| ANGLE GROUP | FLAT SURFACE |
|---|---|
| 0 DEGREES | P1,P2,P3,P6,P7,P8 |
| 90 DEGREES | P4,P5 |

| ANGLE GROUP | DISTANCE GROUP | FLAT SURFACE |
|---|---|---|
| 0 DEGREES | G1 | P1,P2,P3 |
|  | G2 | P6,P7,P8 |
| 90 DEGREES | G3 | P4,P5 |

[ENDPOINT, ENDPOINT]

22 RULE INFORMATION STORAGE UNIT

| No. | CONNECTION RELATIONSHIP 22a | | TYPE 22b |
|---|---|---|---|
| | NODE RELATIONSHIP 22aa | CONNECTION POSITION 22ab | |
| 1 | □—□—□ | [MIDPOINT, ENDPOINT][ENDPOINT, MIDPOINT] | I-BEAM |
| 2 | □—□ | [ENDPOINT, ENDPOINT] | L-BEAM |
| 3 | □—□—□ | [ENDPOINT, ENDPOINT][ENDPOINT, ENDPOINT] | U-BEAM |

FIG.14

23 STANDARD VALUE STORAGE UNIT

| TYPE | STANDARD VALUES | | | | |
|---|---|---|---|---|---|
| | ID | h | b | $t_w$ | ... |
| I-BEAM | HE 100 AA | 91 | 100 | 4.2 | ... |
| | HE 100 A | 96 | 100 | 5 | ... |
| | ⋮ | ⋮ | ⋮ | ⋮ | ⋮ |
| L-BEAM | ID | ... | ... | ... | ... |
| | ... | ... | ... | ... | ... |
| | ⋮ | ⋮ | ⋮ | ⋮ | ⋮ |
| U-BEAM | ID | ... | ... | ... | ... |
| | ... | ... | ... | ... | ... |
| | ⋮ | ⋮ | ⋮ | ⋮ | ⋮ |

23a 23b

THREE-DIMENSIONAL MODEL GENERATING DEVICE, METHOD OF DETERMINING STRUCTURAL MEMBER, AND PROGRAM

BACKGROUND OF THE INVENTION

The present invention relates to a three-dimensional model generating device, a method of determining a structural member, and a program.

As the related art of this technical field, there is given Japanese Patent Laid-open Publication No. 2014-109555. In Japanese Patent Laid-open Publication No. 2014-109555, there is a description that a three-dimensional point group forming a columnar object may be accurately detected even when the columnar object is tilted at an angle, or when another object is adjacent to the columnar object.

However, with a related-art three-dimensional model generating device, a structural member that has flat surfaces and that a structure is constructed from is not automatically determined based on the three-dimensional point group data.

For example, steel beams, such as I-beams, L-beams, and U-beams, that the plant constructed from have flat surfaces. With the related-art three-dimensional model generating device, the steel beams that the plant is constructed from are not automatically determined based on the three-dimensional point group data.

In Japanese Patent Laid-open Publication No. 2014-109555, a three-dimensional point group forming a columnar object may be accurately detected, but there is no description that structural members, such as steel beams, having flat surfaces are automatically determined from the structure.

SUMMARY OF THE INVENTION

Accordingly, it is an object of the present invention to provide a technology capable of automatically determining a structural member that is included in a structure and has flat surfaces.

This application includes a plurality of means for solving at least a part of the above-mentioned problem. An example of those means is as follows. In order to solve the above-mentioned problem, according to one embodiment of the present invention, there is provided a three-dimensional model generating device, including: an input unit configured to input three-dimensional point group data of a structure; a flat surface extraction unit configured to extract flat surfaces of the structure based on the three-dimensional point group data; a grouping unit configured to group the flat surfaces into flat surface groups based on an angle of each of the flat surfaces with respect to a reference direction and a distance between the flat surfaces; a connection relationship extraction unit configured to extract a connection relationship between the grouped flat surface groups; and a determination unit configured to determine a structural member that the structure is constructed from based on the extracted connection relationship According to the present invention, the structural member that is included in the structure and has the flat surfaces can be automatically determined. Problems to be solved by the present invention, configurations, and advantageous effects other than those described above according to the present invention are made clear based on the following description of an embodiment of the present invention.

BRIEF DESCRIPTION OF THE DRAWINGS

FIG. 6 is a table for showing angle groups of flat surfaces in the example illustrated in FIG. 5

FIG. 7 is a table for showing distance groups of the flat surfaces in the example illustrated in FIG. 5.

FIG. 13 is a table for showing a data structure example of a rule information storage unit.

FIG. 14 is a table for showing a data structure example of a standard value storage unit.

DESCRIPTION OF THE PREFERRED EMBODIMENTS

In the following, a description is given of an embodiment of the present invention with reference to the drawings.

Figure 1:
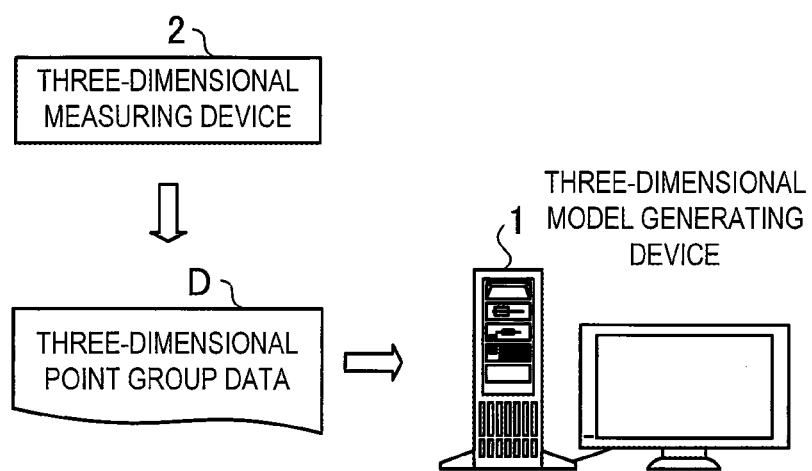
FIG. 1 is a diagram for illustrating a three-dimensional model generating device according to an embodiment of the present invention.

FIG. 1 is a diagram for illustrating a three-dimensional model generating device according to the embodiment of the present invention. A three-dimensional model generating device 1 illustrated in FIG. 1 is an information processing device, such as a personal computer or a server. In FIG. 1, in addition to the three-dimensional model generating device 1, a three-dimensional measuring device 2 and three-dimensional point group data D output by the three-dimensional measuring device 2 are illustrated.

The three-dimensional measuring device 2 is configured to, for example, radiate a laser beam on each site of structural members (parts) that a plant is constructed from, and output the three-dimensional point group data D. The three-dimensional point group data D output by the three-dimensional measuring device 2 includes, for example, measurement point coordinates (x, y, z) of the part obtained by the laser beam, and red (R) green (G), and blue (B) color information.

The three-dimensional point group data D measured by the three-dimensional measuring device 2 is input to the three-dimensional model generating device 1. The three-dimensional model generating device 1 is configured to automatically determine the steel beams having flat surfaces that the plant is constructed from based on the three-dimensional point group data D measured by the three-dimensional measuring device 2. For example, a plant may be constructed from steel beams, such as I-beams, L-beams, and U-beams, and parts such as tubular pipes and tanks. The three-dimensional model generating device 1 is configured to automatically determine the steel beams, such as I-beams, L-beams, and U-beams, from among such parts that the plant is constructed from.

The three-dimensional model generating device 1 is configured to generate, when steel beams that the plant is constructed from have been automatically determined, three-dimensional computer-aided design (CAD) data of the steel beams. The three-dimensional model generating device 1 is configured to display a three-dimensional model of the steel beams that the plant is constructed from on a display device based on the Generated three-dimensional CAD data of the steel beams.

Figure 2:
FIG. 2 is a diagram for illustrating an example of three-dimensional point group data input to the three-dimensional model generating device.

FIG. 2 is a diagram for illustrating an example of the three-dimensional point group data D input to the three-dimensional model generating device 1. In FIG. 2, an example is illustrated in which the three-dimensional point group data D of a portion of the plant is visualized. In FIG. 2, a portion of the plant is visualized in black and white. However, the three-dimensional point group data D, which may include R, G, and B color information as described above, may be represented in colors other than black and white. The three-dimensional point group data D including measurement point coordinates (x, y, z) of the plant such as those illustrated in FIG. 2 and R, G, and B color information is input to the three-dimensional model generating device 1.

Figure 3:
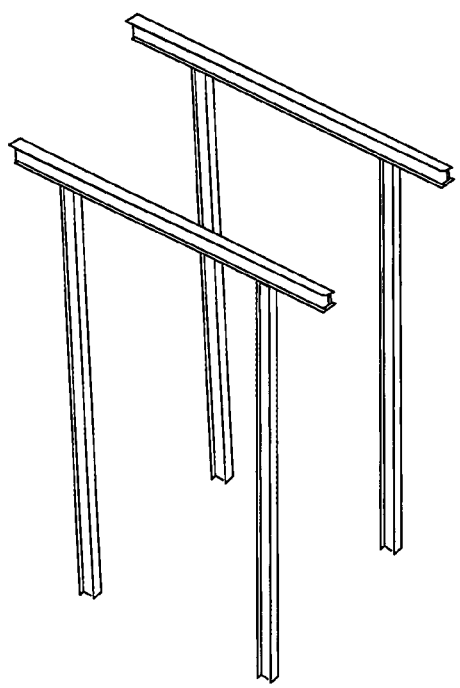
FIG. 3 is a diagram for illustrating an example of a three-dimensional model displayed on a display device by the three-dimensional model generating device.

FIG. 3 is a diagram for illustrating an example of the three-dimensional model displayed on the display device by the three-dimensional model generating device 1. The three-dimensional model illustrated in FIG. 3 is a three-dimensional model of the steel beams of the plant illustrated in FIG. 2.

As described above with reference to FIG. 1, the three-dimensional model generating device 1 is configured to automatically determine the steel beams of the plant based on the three-dimensional point group data D measured by the three-dimensional measuring device 2. The three-dimensional model generating device 1 is configured to generate three-dimensional CAD data of the automatically-determined steel beams of the plant, and display on the display device a three-dimensional model such as that illustrated in FIG. 3 of the steel beams that the plant is constructed from.

The above-mentioned three-dimensional model generating device 1 is configured to automatically determine the steel beams that the plant is constructed from. However, the three-dimensional model generating device 1 is not limited to this, and may, for example, be configured to automatically determine the steel beams of a structure other than a plant.

Further, the above-mentioned three-dimensional model generating device 1 is configured to display a three-dimensional model of the steel beams that the plant is constructed from on a display device. However, the three-dimensional model generating device 1 is not limited to this, and may, for example, be configured to generate three-dimensional CAD data of the parts other than steel beams that the plant is constructed from, and to display that three-dimensional model on the display device.

Figure 4:
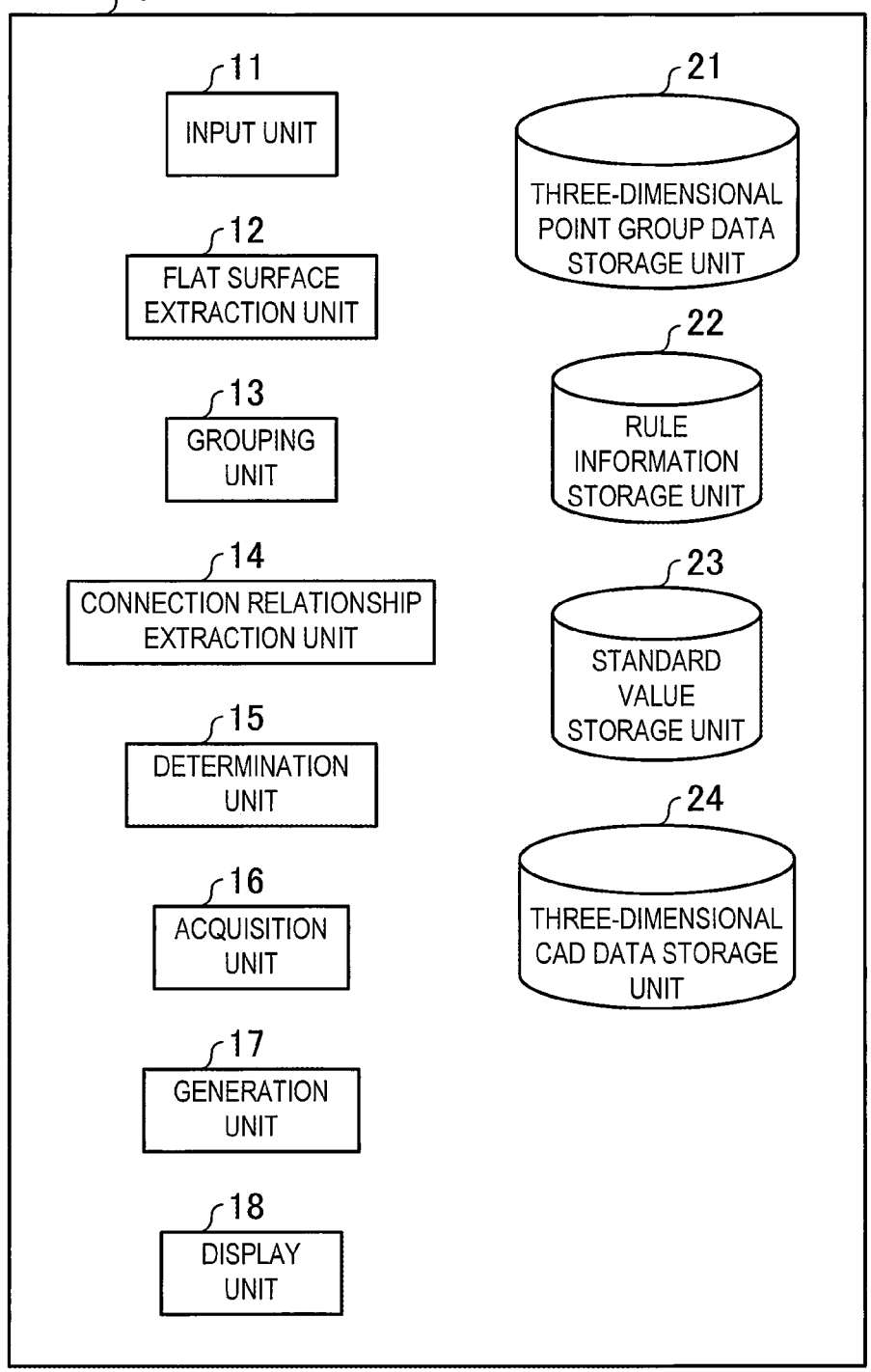
FIG. 4 is a diagram for illustrating a function block example of the three-dimensional model generating device.

FIG. 4 is a diagram for illustrating a function block example of the three-dimensional model generating device 1. As illustrated in FIG. 4, the three-dimensional model generating device 1 includes an input unit 11, a flat surface extraction unit 12, a grouping unit 13, a connection relationship extraction unit 14, a determination unit 15, an acquisition unit 16, a generation unit 17, and a display unit 18. Further, the three-dimensional model generating device 1 also includes a three-dimensional point group data storage unit 21, a rule information storage unit 22, a standard value storage unit 23, and a three-dimensional CAD data storage unit 24.

The input unit 11 is configured to input information based on an operation by the user on an input device, for example. The input unit 11 is configured to store the input information in a predetermined storage unit.

For example, the input unit 11 inputs the three-dimensional point group data of the plant measured by the three-dimensional measuring device 2, and stores the input three-dimensional point group data in the three-dimensional point group data storage unit 21.

Further, the input unit 11 is configured to input rule information on the steel beams. The rule information on the steel beams is, for example, input in advance by the user before the three-dimensional model generating device 1 automatically determines the steel beams of the plant. The input unit 11 is configured to store the input rule information on the steel beams in the rule information storage unit 22. The rule information on the steel beams is described in more detail later.

Further, the input unit 11 is configured to input standard values of the dimensions of the steel beams. The standard values of the dimensions of the steel beams are, for example, input in advance by the user before the three-dimensional model generating device 1 automatically determines the steel beams of the plant. The input unit 11 is configured to store the input standard values of the dimensions of the steel beams in the standard value storage unit 23. The standard values of the dimensions of the steel beams are described in more detail later.

The flat surface extraction unit 12 is configured to refer to the three-dimensional point group data storage unit 21 and to extract the flat surfaces of the parts that the plant is constructed from. This is because the steel beams, such as i-beams, L-beams, and U-beams, have flat surfaces. The flat surface extraction unit 12 is configured to, for example, fit the flat surfaces to the three-dimensional point group data stored in the three-dimensional point group data storage unit 21, and to extract the flat surfaces of the parts that the plant is constructed from. Extraction of the flat surfaces based on flat surface fitting may be performed using typical technology.

The grouping unit 13 is configured to group the flat surfaces extracted by the flat surface extraction unit 12. The grouping unit 13 groups the flat surfaces extracted by the flat surface extraction unit 12 based on an angle with respect to a reference direction and a distance between the flat surfaces.

Figure 5:
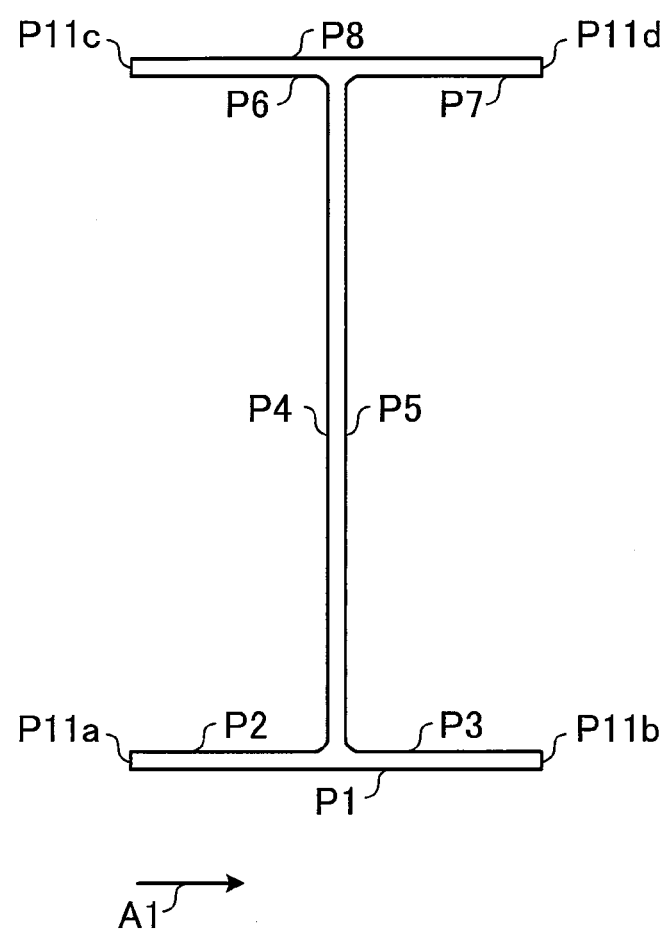
FIG. 5 is a diagram for illustrating an example of flat surface extraction and grouping.

FIG. 5 is a diagram for illustrating an example of flat surface extraction and grouping. In FIG. 5, a cross-section of an I-beam measured by the three-dimensional measuring device 2 is illustrated.

First, flat surface extraction is described. The flat surface extraction unit 12 is configured to extract the flat surfaces of the I-beam by flat surface fitting. For example, the flat surface extraction unit 12 extracts flat surfaces P1 to P8 as illustrated in FIG. 5.

In FIG. 5, for ease of description, flat surface extraction for one I-beam is described. However, the flat surface extraction unit 12 is configured to perform flat surface fitting on all (or a part of) the three-dimensional point group data stored in the three-dimensional point group data storage unit 21. In other words, the flat surface extraction unit 12 is configured to extract all (or a part of) the flat surfaces of the parts included in the plant.

Depending on the size and width of the flat surfaces of the I-beam, it may not be necessary for the flat surface extraction unit 12 to extract the flat surfaces of the I-beam. For example, it is not necessary for the flat surface extraction unit 12 to extract flat surfaces having a smaller surface area than a predetermined threshold. Specifically, it is not necessary for the flat surface extraction unit 12 to extract flat surfaces P11a to P11d of FIG. 5. Flat surfaces having a small surface area, such as the flat surfaces P11a to P11d, may not have been measured by the three-dimensional measuring device 2, for example. In view of this, the flat surface extraction unit 12 may be configured to not extract flat surfaces having a smaller surface area than a predetermined threshold. However, whether or not flat surfaces having a small surface area are to be extracted is a specification issue. Therefore, the flat surface extraction unit 12 is configured to extract flat surfaces having a small surface area (e.g., flat surfaces P11a to P11d).

Next, grouping of the flat surfaces is described. First, the grouping unit 13 is configured to group the flat surfaces extracted by the flat surface extraction unit 12 into Groups of flat surfaces having a predetermined angle. For example, the grouping unit 13 groups the flat surfaces into groups of flat surfaces having a predetermined angle with respect to a reference direction.

For example, in the case of the example illustrated in FIG. 5, the flat surfaces P1, P2, P3, P6, P7, and P8 are at angle of 0 degrees (or 180 degrees) with respect to a reference direction A1. Further, the flat surfaces P4 and P5 are at angle of 90 degrees with respect to the reference direction A1. Therefore, the grouping unit 13 groups the flat surfaces into a "flat surfaces P1, P2, P3, P6, P7, and P8" group that are at an angle of 0 degrees with respect to the reference direction A1 and a "flat surfaces P4 and P5" group that are at an angle of 90 degrees with respect to the reference direction A1.

FIG. 6 is a table for showing the angle groups of the flat surfaces in the example illustrated in FIG. 5. In the case of the example illustrated in FIG. 5, the "flat surfaces P1, P2, P3, P6, P7, and P8" are grouped into an angle group of "0 degrees" and the "flat surfaces P4 and P5" are grouped into an angle group of "90 degrees".

More specifically, as shown in a table 31 of FIG. 6, the grouping unit 13 is configured to group the "flat surfaces P1 to P8" of FIG. 5 into a "flat surfaces P1, P2, P3, P6, P7, and P8" angle group of "0 degrees" and a "flat surfaces P4 and P5" angle group of "90 degrees".

In the example shown in FIG. 6, there are only two angle groups, "0 degrees" and "90 degrees". However, in actual practice, more angle groups than that exist. For example, angle groups exist at predetermined intervals, such as intervals of x degrees (x is a positive number). This is because the plant includes flat surfaces that are facing in various directions. in other words, the grouping unit 13 is configured to group the flat surfaces extracted by the flat surface extraction unit 12 for each predetermined angle.

The angle of the flat surfaces with respect to the reference direction A1 includes a slight error caused by, for example, a measurement error andthe like of the three-dimensional measuring device 2. Therefore, the grouping unit 13 may also be configured to group the flat surfaces into groups of flat surfaces that are close to the same angle. For example, the grouping unit 13 may be configured to group the flat surfaces into groups of flat surfaces that are at "0 degrees ±α" and "90 degrees ±α" with respect to the reference direction A1.

The grouping unit 13 is configured to further group, when the flat surfaces have been groupedbased on angle, the flat surfaces grouped based on angle into groups of flat surfaces that are within a predetermined distance.

For example, the grouping unit 13 groups the flat surfaces of the angle group of "0 degrees" into groups of flat surfaces that are within a predetermined distance, and to group the flat surfaces of the angle group of "90 degrees" into groups of flat surfaces that are within a predetermined distance.

Specifically, in FIG. 5, among the "flat surfaces P1, P2, P3, P6, P7, and P8" grouped into the angle group of "0 degrees", the "flat surfaces P1, P2, and P3" are close to each other (within a predetermined distance of each other). Further, among the "flat surfaces P1, P2, P3, P6, P7, and P8" grouped into the angle group of "0 degrees", the "flat surfaces P6, P7, and P8" are close to each other (within a predetermined distance of each other). Therefore, in the case of the example illustrated in FIG. 5, the grouping unit 13 is configured to further group the "flat surfaces P1, P2, P3, P6, P7, and P8" angle group of "0 degrees" into a "flat surfaces P1, P2, and P3" group and a "flat surfaces P6, P7, and P8" group.

Further, the "flat surfaces P4 and P5" grouped into the angle group of "90 degrees" are close to each other (within a predetermined distance of each other). Therefore, the grouping unit 13 is configured to group the "flat surfaces P4 and P5" angle group of "90 degrees" into a "flat surfaces P4 and P5" group.

FIG. 7 is a table for showing the distance groups of the flat surfaces in the example illustrated in FIG. 5. In the case of the example illustrated in FIG. 5, the "flat surfaces P1, P2, P3, P6, P7, and P8" grouped into the angle group of "0 degrees" are grouped into "flat surfaces P1, P2, and P3" and "flat surfaces P6, P7, and P8" as distance groups within a predetermined distance. The "flat surfaces P4 and P5" grouped into the angle group of "90 degrees" are grouped into "flat surfaces P4 and P5" as a distance group within a predetermined distance.

More specifically, as shown in a table 32 of FIG. 7, the grouping unit 13 is configured to ultimately group the "flat surfaces P1 to P8" of FIG. 5 into a "flat surfaces P1, P2, and P3" group G1, a "flat surfaces P6, P7, and P8" group G2, and a "flat surfaces P4 and P5" group G3.

Figure 8A:
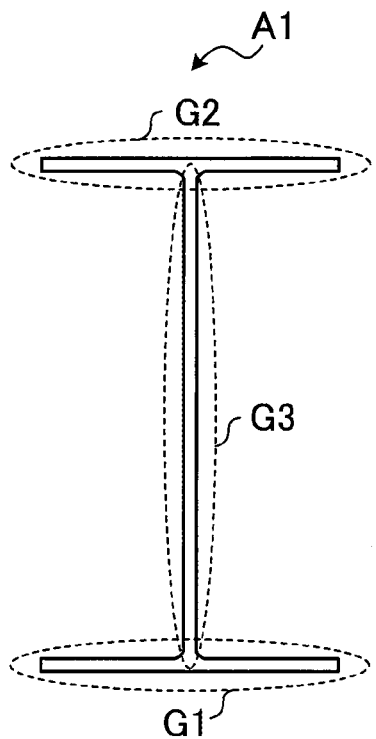
FIGS. 8A, B, and C are diagrams for illustrating a grouping result of steel beam flat surfaces by a grouping unit.
Figure 8B:
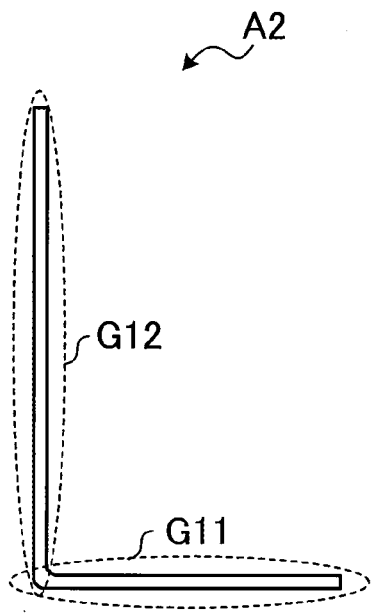
Figure 8C:
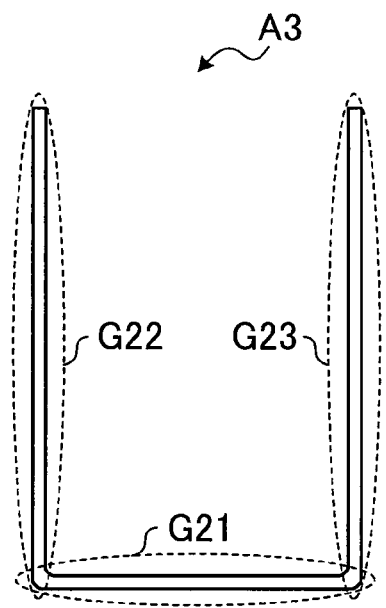

FIG. 8A, FIG. 8B and FIG. 8C are diagrams for illustrating a grouping result of the steel beam flat surfaces by the grouping unit 13. The grouping result of the flat surfaces of the I-beam illustrated in FIG. 5 by the grouping unit 13 is indicated by an arrow Al of FIG. 8A. The flat surfaces of the I-beam illustrated in FIG. 5 are Grouped into groups G1, G2, and G3, as indicated by the dotted outlines of the arrow A1. The groups G1, G2, and G3 in FIG. 8A correspond to the "G1, G2, and G3" of the distance groups in the table 32 shown in FIG. 7.

A grouping example of the flat surfaces of an L-beam is indicated by an arrow A2 of FIG. 8B. In the case of an L-beam, the grouping unit 13 is configured to group the flat surfaces into two groups, a group G11 and a group G12, as indicated by the dotted outlines of the arrow A2.

Further, a grouping example of the flat surfaces of a U-beam is indicated by an arrow A3 of FIG. 8C. In the case of a U-beam, the grouping unit 13 is configured to group the flat surfaces into three groups, a group G21, a group G22, and a group 23 as indicated by the dotted outlines of the arrow A3.

The grouping unit 13 is configured to, when the flat surfaces extracted by the flat surface extraction unit 12 have been grouped, divide the grouped flat surfaces (flat surface groups) into line segments. More specifically, the grouping unit 13 is configured to extract a steel beam framework (cross-sectional framework of the steel beams).

FIG. 9A, FIG. 9B, FIG. 9C and FIG. 9D are diagrams for illustrating line segmentation of a steel beam. A portion of the I-beam illustrated in FIG. 5 is indicated by an arrow A11 in FIG. 9A. In FIG. 9A-D, parts that are the same as in FIG. 5 are denoted by the same reference symbols.

The grouping unit 13 is configured to draw, when the flat surfaces have been Grouped, line segments so that an average distance of each flat surface in that flat surface group is minimized. During this process, the grouping unit 13 extends the line segments so that the line segments of each flat surface group are directly connected.

For example, the grouping unit 13 draws a line segment 41a for the flat surface group of "flat surfaces P1, P2, and P3". Further, the grouping unit 13 extends a line segment 41b so that, for the flat surface group of "flat surfaces P4 and P5", the line segment 41b is directly connected to the line segment 41a.

Figure 9A:
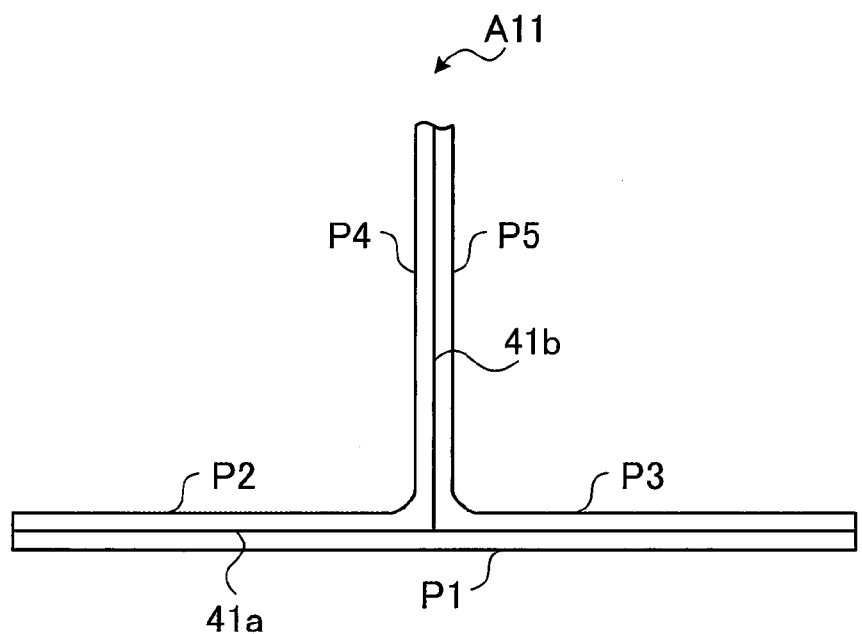
FIGS. 9A, B, C and D are diagrams for illustrating line segmentation of a steel beam.
Figure 9B:
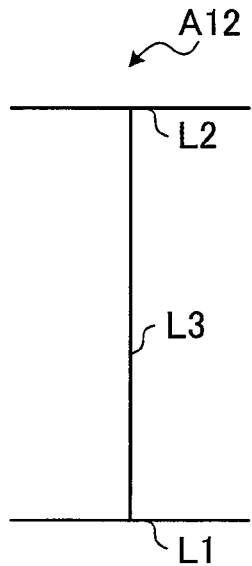

A line segmentation result of the I-beam is indicated by an arrow A12 in FIG. 9B. For example, a line segment L1 represents a line segmentation result of the flat surface group of the group G1 indicated by the arrow A1 in FIG. 8A, a line segment L2 of FIG. 9B represents a line segmentation result of the flat surface group of the group G2 of FIG. 8A, and a line segment L3 of FIG. 9B, represents a line segmentation result of the flat surface Group of the Group G3 of FIG. 8A.

Figure 9C:
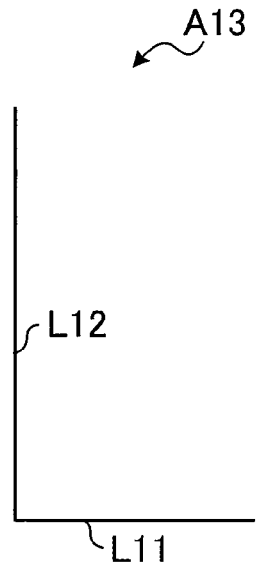

Further, a line segmentation result of the L-beam is indicated by an arrow A13 in FIG. 9C. For example, a line segment L11 represents a line segmentation result of the flat surface group of the group G11 indicated by the arrow A2 in FIG. 8B, and a line segment L12 of FIG. 9C represents a line segmentation result of the flat surface group of the group G12 of FIG. 8B.

Figure 9D:
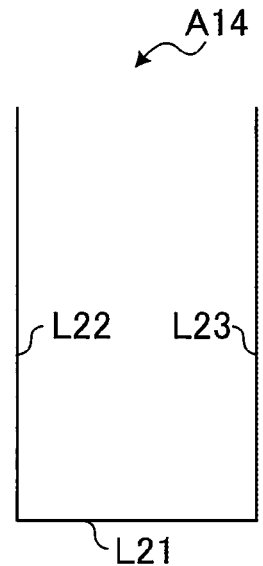

Further, a line segmentation result of the U-beam is indicated by an arrow A14 in FIG. 9D. For example, a line segment L21 represents a line segmentation result of the flat surface group of the group G21 indicated by the arrow A3 in FIG. 8C, a line segment L22 of FIG. 9D represents a line segmentation result of the flat surface group of the group G22 of FIG. 8C, and a line segment L23 of FIG. 9D represents a line segmentation result of the flat surface group of the group G23 of FIG. 8C.

In this case, the connection relationships of the line segments for the I-beam, the L-beam, and the U-beam are different from each other. For example, in FIG. 9B, for the I-beam, the line segment L1 and the line segment L3 are connected at a midpoint of the line segment L1 and an endpoint (end) of the line segment L3. Further, the line segment L2 and the line segment L3 are connected at a midpoint of the line segment L2 and an endpoint of the line segment L3.

Further in FIG. 9C, for the L-beam, the line segment L11 and the line segment L12 are connected at an endpoint of the line segment L11 and an endpoint of the line segment L12.

Further in FIG. 9D, for the U-beam, the line segment L21 and the line segment L22 are connected at an endpoint of the line segment L21 and an endpoint of the line segment L22. Further, the line segment L21 and the line segment L23 are connected at an endpoint of the line segment L21 and an endpoint of the line segment L23.

Therefore, extracting a connection relationship of the flat surface groups (connection relationship of the line segments representing the flat surface groups) grouped by the grouping unit 13 allows the steel beams (I-beams, L-beams, and U-beams) to be determined from among the parts that the plant is constructed from.

Returning to the description of FIG. 4, the connection relationship extraction unit 14 is configured to extract a connection relationship between the flat surface groups grouped by the grouping unit 13. For example, the connection relationship extraction unit 14 extracts a connection relationship between the grouped flat surface groups by using the line segmentation results of the flat surface groups by the grouping unit 13.

Figure 10A:
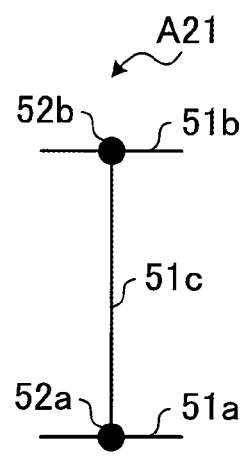
FIGS. 10A and B are diagrams for illustrating a connection relationship of an I-beam.

FIG. 10A and FIG. B are diagrams for illustrating a connection relationship of an I-beam. A line segmentation result of the I-beam is indicated by an arrow A21 in FIG. 10A. The I-beam is divided into three flat surface groups, as indicated by the arrow Al in FIG. 8A. Line segments 51a to 51c in FIG. 10A represent a line segmentation result of each of the flat surface groups of the I-beam. The line segment 51a corresponds to the line segment of the group G1 of the I-beam indicated by the arrow Al in FIG. 8A. The line segment 51b corresponds to the line segment of the group G2 of the I-beam indicated by the arrow A1 in FIG. 8A. The line segment 51c corresponds to the line segment of the group G3 of the I-beam indicated by the arrow A1 in FIG. 8A.

In FIG. 10A, points 52a and 52b represent a connecting portion of the line segments 51a to 51c. More specifically, the points 52a and 52b represent a connecting portion of the flat surface groups grouped by the grouping unit 13.

The connection relationship extraction unit 14 is configured to extract a connection relationship between the flat surface groups grouped by the grouping unit 13. The connection relationship extraction unit 14 is configured to extract a connection relationship between the flat surface groups by plotting the connection relationships of the flat surface groups on a graph.

For example, the connection relationship extraction unit 14 plots the flat surface groups on a graph by using the line segmentation results of the flat surface groups grouped by the grouping unit 13. Specifically, the connection relationship extraction unit 14 represents the line segments 51a, 51b, and 51c of the arrow A21 in FIG. 10A as nodes 53a, 53b, and 53c, as indicated by an arrow A22 in FIG. 10B. The node 53a of FIG. 10B corresponds to the line segment 51a of FIG. 10A, the node 53b of FIG. 10B corresponds to the line segment 51b of FIG. 10A, and the node 53c of FIG. 10B corresponds to the line segment 51c of FIG. 10A.

Figure 10B:
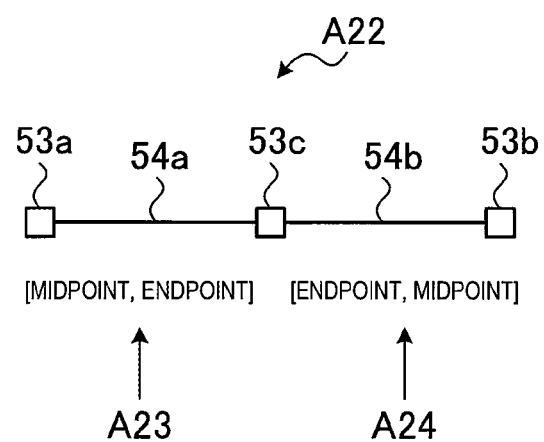

Further, the connection relationship extraction unit 14 is configured to indicate the presence or absence of connections of the line segments 51a, 51b, and 51c indicated by the arrow A21 of FIG. 10A by arcs 54a and 54b, as indicated by the arrow A22 of FIG. 10B.

For example, as indicated by the arrow A21 of FIG. 10A, the line segment 51a and the line segment 51c are connected at the point 52a. Therefore, as indicated by the arrow A22 of FIG. 10B, the connection relationship extraction unit 14 links the node 53a of FIG. 10B corresponding to the line segment 51a of FIG. 10A and the node 53c of FIG. 10B corresponding to the line segment 51c of FIG. 10A by the arc 54a of FIG. 10B.

Further, as indicated by the arrow A21 of FIG. 10A, the line segment 51b and the line segment 51c are connected at the point 52*b*. Therefore, as indicated by the arrow A22 of FIG. 10B, the connection relationship extraction unit 14 links the node 53*b* of FIG. 10B corresponding to the line segment 51*b* of FIG. 10A and the node 53*c* of FIG. 10B corresponding to the line segment 51*c* of FIG. 10A by the arc 54*b* of FIG. 10B.

As indicated by the arrow A21 of FIG. 10A, the line segment 51*a* and the line segment 51*b* are not directly connected. Therefore, as indicated by the arrow A22 of FIG. 10B, the connection relationship extraction unit 14 does not link the node 53*a* of FIG. 10B corresponding to the line segment 51*a* of FIG. 10A and the node 53*b* of FIG. 10B corresponding to the line segment 51*b* of FIG. 10A by a direct arc.

The connection relationship extraction unit 14 is configured to extract, when the line segments 51*a*, 51*b*, and 51*c* of FIG. 10A have been plotted on a graph as described above, the connection positions of the line segments 51*a*, 51*b*, and 51*c*. For example, the line segment 51*a* and the line segment 51*c* are connected at the midpoint of the line segment 51*a* and the endpoint of the line segment 51*c*. Therefore, as indicated by an arrow A23 of FIG. 10B, the connection relationship extraction unit 14 extracts the connection position of the node 53*a* and the node 53*c* as [midpoint, endpoint]. Similarly, the line segment 51*c* and the line segment 51*b* of FIG. 10A are connected at the endpoint of the line segment 51*c* and the midpoint of the line segment 51*b*. Therefore, as indicated by an arrow A24 of FIG. 10B, the connection relationship extraction unit 14 extracts the connection position of the node 53*c* and the node 53*b* as [endpoint, midpoint].

Thus, the connection relationship extraction unit 14 is configured to extract, when an I-beam is included in the parts that the plant is constructed from, the connection relationship having the node relationship indicated by the arrow A22 of FIG. 10B and the connection positions indicated by the arrows A23 and A24.

Figure 11A:
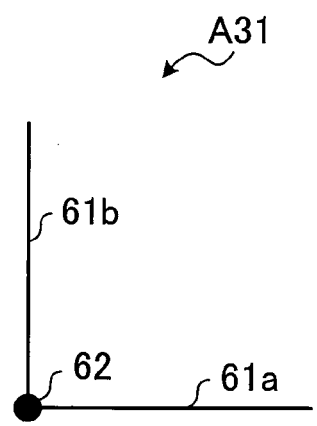
FIGS. 11A and B are diagrams for illustrating a connection relationship of an L-beam.
Figure 11B:
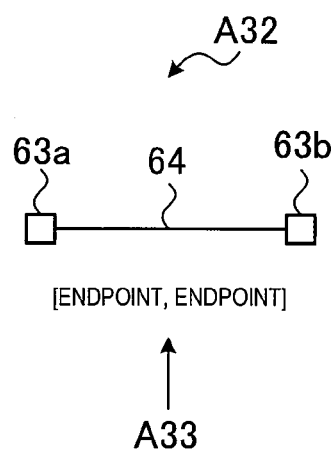

FIG. 11A and FIG. 11B are diagrams for illustrating a connection relationship of an L-beam. A line segmentation result of the L-beam is indicated by an arrow A31 in FIG. 11A. The L-beam is divided into two flat surface groups, as indicated by the arrow A2 in FIG. 8B. Line segments 61*a* and 61*b* in FIG. 11A represent a line segmentation result of each of the flat surface groups of the L-beam.

A point 62 represents a connecting portion of the line segments 61*a* and 61*b*. More specifically, the point 62 represents a connecting portion of the flat surface groups grouped by the grouping unit 13.

The connection relationship extraction unit 14 is configured to extract a connection relationship between the flat surface groups grouped by the grouping unit 13. The connection relationship extraction unit 14 is configured to extract a connection relationship between the flat surface groups by plotting the connection relationships of the flat surface groups on a graph.

For example, the connection relationship extraction unit 14 plots the flat surface groups on a graph by using the line segmentation results of the flat surface groups grouped by the grouping unit 13. Specifically, the connection relationship extraction unit 14 represents the line segments 61*a* and 61*b* of the arrow A31 of FIG. 11A as nodes 63*a* and 63*b*, as indicated by an arrow A32 of FIG. 11B. The node 63*a* of FIG. 11B corresponds to the line segment 61*a* of FIG. 11A, and the node 63*b* of FIG. 11B corresponds to the line segment 61*b* of FIG. 11A.

Further, the connection relationship extraction unit 14 is configured to indicate the presence or absence of a connection of the line segments 61*a* and 61*b* indicated by the arrow A31 of FIG. 11A by an arc 64, as indicated by the arrow A32 of FIG. 11B.

For example, as indicated by the arrow A31 of FIG. 11A, the line segment 61*a* and the line segment 61*b* are connected at the point 62. Therefore, as indicated by the arrow A32 of FIG. 11B, the connection relationship extraction unit 14 links the node 63*a* corresponding to the line segment 61*a* of FIG. 11A and the node 63*b* of FIG. 11B corresponding to the line segment 61*b* of FIG. 11A by the arc 64 of FIG. 11B.

The connection relationship extraction unit 14 is configured to extract, when the line segments 61*a* and 61*b* of FIG. 11A have been plotted on a graph as described above, the connection position of the line segments 61*a* and 61*b*. For example, the line segment 61*a* and the line segment 61*b* are connected at the endpoint of the line segment 61*a* and the endpoint of the line segment 61*b*. Therefore, as indicated by an arrow A33 of FIG. 11B, the connection relationship extraction unit 14 extracts the connection position of the node 63*a* and the node 63*b* as [endpoint, endpoint].

Thus, the connection relationship extraction unit 14 is configured to extract, when an L-beam is included in the parts that the plant is constructed from, the connection relationship having the node relationship indicated by the arrow A32 of FIG. 11B and the connection position indicated by the arrows A33.

Figure 12A:
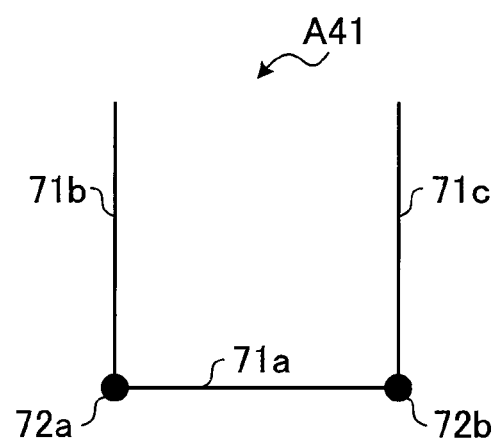
FIGS. 12A and B are diagrams for illustrating a connection relationship of a U-beam.

FIGS. 12A and B are diagrams for illustrating a connection relationship of a U-beam. A line segmentation result of the U-beam is indicated by an arrow A41 in FIG. 12A. The U-beam is divided into three flat surface groups, as indicated by the arrow A3 in FIG. 8G. Line segments 71*a* to 71*c* in FIG. 12A represent a line segmentation result of each of the flat surface groups of the U-beam.

In FIG. 12A, points 72*a* and 72*b* represent a connecting portion line segments 71*a* to 71*c*. More specifically, the points 72*a* and 72*b* represent a connecting portion of the flat surface Groups grouped by the grouping unit 13.

The connection relationship extraction unit 14 is configured to extract a connection relationship between the flat surface groups grouped by the grouping unit 13. The connection relationship extraction unit 14 is configured to extract a connection relationship between the flat surface groups by plotting the connection relationships of the flat surface groups on a graph.

For example, the connection relationship extraction unit 14 plots the flat surface groups on a graph by using the line segmentation results of the flat surface groups grouped by the grouping unit 13. Specifically, connection relationship extraction unit 14 represents the line segments 71*a*, 71*b*, and 71*c* of the arrow A41 in FIG. 12A as nodes 73*a*, 73*b*, and 73*c*, as indicated by an arrow A42 in FIG. 12S. The node 73*a* of FIG. 12S corresponds to the line segment 71*a* of FIG. 12A, the node 73*b* of FIG. 12B corresponds to the line segment 71*b* of FIG. 12A, and the node 73*c* of FIG. 12B corresponds to the line segment 71*c* of FIG. 12A.

Figure 12B:
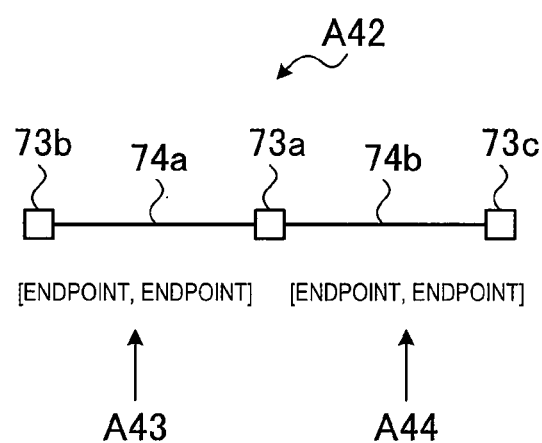

Further, the connection relationship extraction unit 14 is configured to indicate the presence or absence of connections of the line segments 71*a*, 71*b*, and 71*c* indicated by the arrow A41 of FIG. 12A by arcs 74*a* and 74*b* of FIG. 12B, as indicated by the arrow A42.

For example, as indicated by the arrow A41 of FIG. 12A, the line segment 71*a* and the line segment 71*c* are connected at the point 72*a*. Therefore, as indicated by the arrow A42 of FIG. 12B, the connection relationship extraction unit 14 links the node 73*a* corresponding to the line segment 71*a* of FIG. 12A and the node 73*b* of FIG. 12B corresponding to the line segment 71*b* of FIG. 12A by the arc 74*a* of FIG. 12B.

Further, as indicated by the arrow A41 of FIG. 12A, the line segment 71*a* and the line segment 71*b* are connected at the point 72*b*. Therefore, as indicated by the arrow A42 of FIG. 12B, the connection relationship extraction unit 14 links the node 73*a* corresponding to the line segment 71*a* of FIG. 12A and the node 73*c* of FIG. 12B corresponding to the line segment 71*c* of FIG. 12A by the arc 74*b* of FIG. 12B.

As indicated by the arrow A41 of FIG. 12A, the line segment 71*b* and the line segment 71*c* are not directly connected. Therefore, as indicated by the arrow A42 of FIG. 12B, the connection relationship extraction unit 14 does not link the node 73*b* of FIG. 12B corresponding to the line segment 71*b* of FIG. 12A and the node 73*c* of FIG. 12B corresponding to the line segment 71*c* of FIG. 12A by a direct arc.

The connection relationship extraction unit 14 is configured to extract, when the line segments 71*a*, 71*b*, and 71*c* of FIG. 12A have been plotted on a graph as described above, the connection positions of the line segments 71*a*, 71*b*, and 71*c*. For example, the line segment 71*a* and the line segment 71*b* are connected at the endpoint of the line segment 71*a* and the endpoint of the line segment 71*b*. Therefore, as indicated by an arrow A43 of FIG. 12B, the connection relationship extraction unit 14 extracts the connection position of the node 73*a* and the node 73*b* as [endpoint, endpoint]. Similarly, the line segment 71*a* and the line segment 71*c* of FIG. 12A are connected at the endpoint of the line segment 71*a* and the endpoint of the line segment 71*c*. Therefore, as indicated by an arrow A44 of FIG. 12B, the connection relationship extraction unit 14 extracts the connection position of the node 73*a* and the node 73*c* as [endpoint, endpoint].

Thus, the connection relationship extraction unit 14 is configured to extract, when a U-beam is included in the parts that the plant is constructed from, the connection relationship having the node relationship indicated by the arrow A42 of FIG. 12B and the connection positions indicated by the arrows A43 and A44.

Returning to the description of FIG. 4, the determination unit 15 is configured to refer to the rule information storage unit 22 and to determine the steel beams that the plant is constructed from based on the connection relationship extracted by the connection relationship extraction unit 14.

The rule information storage unit 22 is now described. The connection relationship and a type of steel beam are associated and stored in the rule information storage unit 22.

FIG. 13 is a table for showing a data structure example of the rule information storage unit 22. As shown in FIG. 13, a connection relationship 22*a* and a type 22*b* are stored in the rule information storage unit 22. The connection relationship 22*a* further includes a node relationship 22*aa* and a connection position 22*ab*. The connection relationship 22*a* and the type 22*b* are stored in advance by the user in the rule information storage unit 22.

The node relationship 22*a a* represents the node relationship of the flat surface groups of steel beams. Examples of the node relationship 22*aa* of the flat surface groups of steel beams include the node relationship indicated by the arrow A22 of FIG. 10B, the node relationship indicated by the arrow A32 of FIG. 11B, and the node relationship indicated by the arrow A42 of FIG. 12B.

The connection position 22*ab* of FIG. 13 represents a connection position of nodes. Examples of the connection position 22*a* b include the connection positions indicated by the arrows A23 and A24 of FIG. 10B, the connection position indicated by the arrow A33 of FIG. 11B, and the connection positions indicated by the arrows A43 and A44 of FIG. 12B.

The type 22*b* of FIG. 13 represents the type of steel beam. Examples of the type 22*b* include I-beams, L-beams, and U-beams.

For example, in a case in which the connection relationship extraction unit 14 has extracted the node relationship indicated by the arrow A22 of FIG. 10B and the connection positions indicated by the arrows A23 and A24 of FIG. 10B, the node relationship and connection 15 positions extracted by the connection relationship extraction unit 14 correspond to the node relationship 22*a* a and the connection position 22*ab* denoted by No. 1 in FIG. 13. Therefore, the determination unit 15 determines that the part of the flat surface group having the connection relationship extracted by the connection relationship extraction unit 14 is an "I-beam".

Returning to the description of FIG. 4, the acquisition unit 16 is configured to refer to the standard value storage unit 23 and to acquire standard values of the dimensions of the type of steel beam determined by the determination unit 15. The connection relationship extracted by the connection relationship extraction unit 14 also includes, for example, mode data (dimension data of the steel beams), such as the shape and arrangement of each flat surface forming the flat surface groups. The acquisition unit 16 is configured to refer to the standard value storage unit 23 and to acquire the standard values of the dimensions of the steel beam closest to the mode data included in the connection relationship.

In general, steel beams have standard values relating to their dimensions. Further, there may be an error or the like included in the measurement values of the three-dimensional measuring device 2. The acquisition unit 16 is configured to correct errors included in the measurement values of the three-dimensional measuring device 2 in view of the standard values of the steel beam determined by the determination unit 15.

The standard value storage unit 23 is now described. The standard value storage unit 23 is configured to store the standard values of each type of steel beam.

FIG. 14 is a table for showing a data structure example of the standard value storage unit 23. As shown in FIG. 14, the standard value storage unit 23 is configured to store a type 23*a* and standard values 23*b*. The type 23*a* and the standard values 23*b* are stored in advance by the user in the standard value storage unit 23.

The type 23*a* represents the type of steel beam. Examples of the type 23*a* include I-beams, L-beams, and U-beams.

The standard values 23*b* represent the standard values of the dimensions of the steel beam (cross-section) corresponding to the type 23*a*. As shown in FIG. 14, there are a plurality of standard values for each type of steel beam.

For example, when the determination unit 15 has determined that a steel beam is an "I-beam", the acquisition unit 16 refers to the standard values 23*b* having "I-beam" for the type 23*a* in the standard value storage unit 23, and acquires the standardvalues that are included in the connection relationship extracted by the connection relationship extraction unit 14 and that are the closest to the mode data of the "I-beam" determined by the determination unit 15.

Returning to the description of FIG. 4, the generation unit 17 is configured to generate three-dimensional CAD data of the steel beam based on the standard values acquired by the acquisition unit 16. For example, the generation unit 17 generates the three-dimensional CAD data of the steel beam based on the standard values of the steel beam (cross-section) acquired by the acquisition unit 16 and a length in a longitudinal direction of the steel beams (direction perpendicular to the cross-section of the steel beam) included in the mode data. The generation unit 17 is configured to store the generated three-dimensional CAD data of the steel beam in the three-dimensional CAD data storage unit 24.

The display unit 18 is configured to generate three-dimensional image data of the steel beams of the plant based on the three-dimensional CAD data stored in the three-dimensional CAD data storage unit 24. The three-dimensional image data generated by the display unit 18 is output to the display device, and a three-dimensional model of the steel beams, such as that illustrated in FIG. 3, is displayed on the display device. The display unit 18 may also be configured to display a three-dimensional model of parts other than steel beams as well.

Operations performed by the three-dimensional model generating device 1 are now described with reference to a flowchart.

Figure 15:
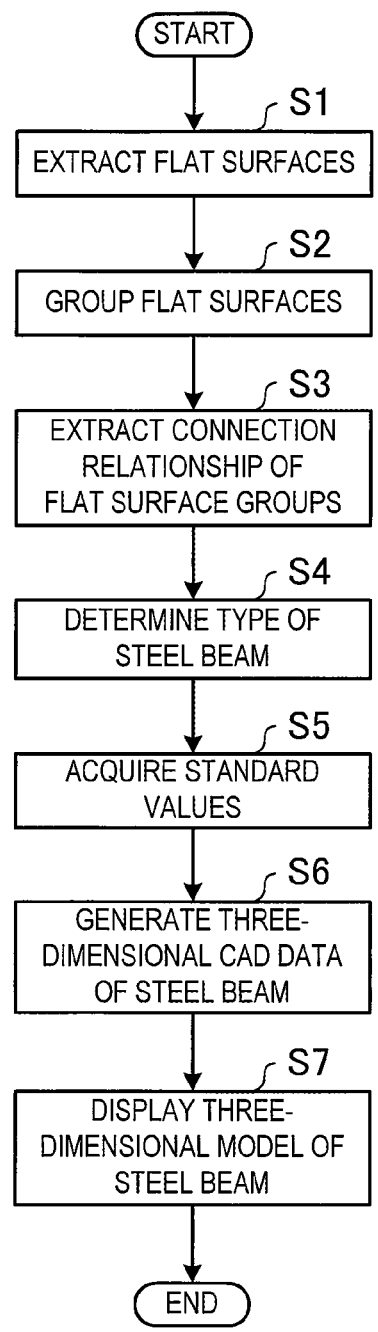
FIG. 15 is a flowchart for illustrating an operation example of the three-dimensional model generating device.

FIG. 15 is a flowchart for illustrating an operation example of the three-dimensional model generating device 1. The three-dimensional model generating device 1 is configured to start the processing of the flowchart illustrated in FIG. 15 based on, for example, an instruction from the user to generate three-dimensional CAD data.

In this example, the three-dimensional point group data of the plant for which three-dimensional CAD data of steel beams is to be generated has been measured by the three-dimensional measuring device 2, and stored in the three-dimensional point group data storage unit 21. Further, rule information including the connection relationship 22a and the type 22b described with reference to FIG. 13 has been stored in the rule information storage unit 22 based on an input from the user, for example. In addition, the standard values of the steel beams have been stored in the standard value storage unit 23 by the user, for example.

First, the flat surface extraction unit 12 refers to the three-dimensional point group data storage unit 21 and extracts the flat surfaces of the parts that the plant is constructed from (Step S1).

Next, the grouping unit 13 groups the flat surfaces extracted in Step S1 (Step S2).

For example, the grouping unit 13 groups the flat surfaces extracted by the flat surface extraction unit 12 based on, as shown in the table 32 of FIG. 7, the angle with respect to the reference direction and the distance between the flat surfaces. As a result, for example, the flat surfaces forming the I-beams L-beams, and U-beams are grouped into groups indicated by dotted outlines, such as those indicated by the arrows A1 to A3 of FIG. 8A-C.

Next, the connection relationship extraction unit 14 extracts a connection relationship between the flat surface groups grouped in Step S2 (Step S3).

For example, when a flat surface group grouped by the grouping unit 13 is a flat surface group forming the I-beam indicated by the arrow Al of FIG. 8A, the connection relationship extraction unit 14 extracts the connection relationship having the node relationship indicated by the arrow A22 of FIG. 10B and the connection positions indicated by the arrows A23 and A24 of FIG. 10B.

Next, the determination unit 15 refers to the rule information storage unit 22 and determines the type of steel beams that the plant is constructed from based on the connection relationship extracted in Step S3 (Step S4).

For example, when the connection relationship extracted by the connection relationship extraction unit 14 is the connection relationship having the node relationship indicated by the arrow A22 of FIG. 10B and the connection positions indicated by the arrows A23 and A24 of FIG. 10B, that connection relationship corresponds to "No. 1" of the rule information storage unit 22 shown in FIG. 13, and hence the determination unit 15 determines that the relevant steel beam is an I-beam.

Next, the acquisition unit 16 refers to the standard value storage unit 23 and acquires the standard values of the type of steel beam determined in Step S4 (Step S5).

For example, when the determination unit 15 has determined that a steel beam is an "I-beam", the acquisition unit 16 refers to the standard values 23b having "I-beam" for the type 23a in the standard value storage unit 23, and acquires the standard values that are included in the connection relationship extracted by the connection relationship extraction unit 14 and that are close to the mode data of the "I-beam" determined by the determination unit 15.

Next, the generation unit 17 generates the three-dimensional CAD data of the steel beam based on the standard values acquired in Step S5 (Step S6). The generation unit 17 stores the generated three-dimensional CAD data of the steel beam in the three-dimensional CAD data storage unit 24.

Next, the display unit 18 generates three-dimensional image data of the steel beams of the plant based on the three-dimensional CAD data stored in the three-dimensional CAD data storage unit 24 in Step S6, and displays a three-dimensional model of the steel beams on the display device (Step S7). Then, the three-dimensional model generating device 1 finishes the processing of this flowchart.

Operations performed by the grouping unit 13 are now described in more detail with reference to a flowchart.

Figure 16:
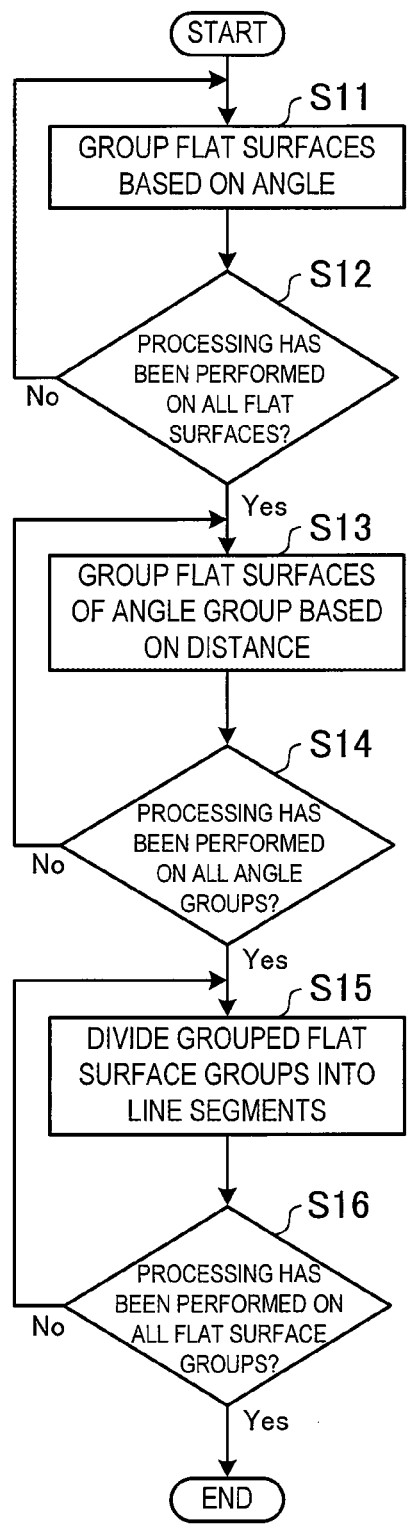
FIG. 16 is a flowchart for illustrating an operation example of the grouping unit.

FIG. 16 is a flowchart for illustrating an operation example of the grouping unit 13. In the flowchart of FIG. 16, the processing operation of Step S2 of FIG. 15 is illustrated in more detail.

First, the grouping unit 13 groups the flat surfaces extracted by the flat surface extraction unit 12 (flat surfaces extracted in Step S1 of FIG. 15) into groups of flat surfaces having a predetermined angle (Step S11).

For example, the grouping unit 13 groups the flat surfaces into groups of flat surfaces having a predetermined angle with respect to a reference direction. Specifically, the grouping unit 13 groups the flat surfaces into predetermined angle groups, such as those shown in the table 31 of FIG. 6.

Next, the grouping unit 13 determines whether or not angle-based grouping processing of the flat surfaces has been executed on all the flat surfaces extracted by the flat surface extraction unit 12 (Step S12). When angle-based grouping processing of the flat surfaces has not been executed on all the flat surfaces extracted by the flat surface extraction unit 12 ("No" in S12), the grouping unit 13 returns the processing to Step S11. When angle-based grouping processing of the flat surfaces has been executed on all the flat surfaces extracted by the flat surface extraction unit 12 ("Yes" in S12), the grouping unit 13 advances the processing to Step S13.

When it is determined in Step S12 that angle-based grouping processing of the flat surfaces has been executed on all the flat surfaces extracted by the flat surface extraction unit 12 ("Yes" in S12), the grouping unit 13 groups the flat surfaces that have been grouped based on angle into groups of flat surfaces that are within a predetermined distance (Step S13).

For example, as shown in the table 32 of FIG. 7, the grouping unit 13 further groups the flat surfaces that have been grouped into angle groups into groups based on distance.

Next, the grouping unit 13 determines whether or not distance-based grouping processing has been executed on all the angle groups (Step S14). When distance-based grouping processing has not been executed on all the angle groups ("No" in S14), the grouping unit 13 returns the processing to Step S13. When distance-based grouping processing has been executed on all the angle groups ("Yes" in S14), the grouping unit 13 advances the processing to Step S15.

When it is determined in Step S14 that distance-based grouping processing has been executed on all the angle groups ("Yes" in S14), the grouping unit 13 divides the grouped flat surface groups (flat surfaces grouped based on angle and distance) into line segments (Step S15).

Next, the grouping unit 13 determines whether or not line segmentation processing has been executed on all the flat surface groups (Step S16). When line segmentation processing has not been executed on all the flat surface groups ("No" in S16), the grouping unit 13 returns the processing to Step S15. When line segmentation processing has been executed on all the flat surface groups ("Yes" in S16), the grouping unit 13 finishes the processing of this flowchart. When the processing of this flowchart is finished, the grouping unit 13 advances the processing to Step S3 of FIG. 15.

Figure 17:
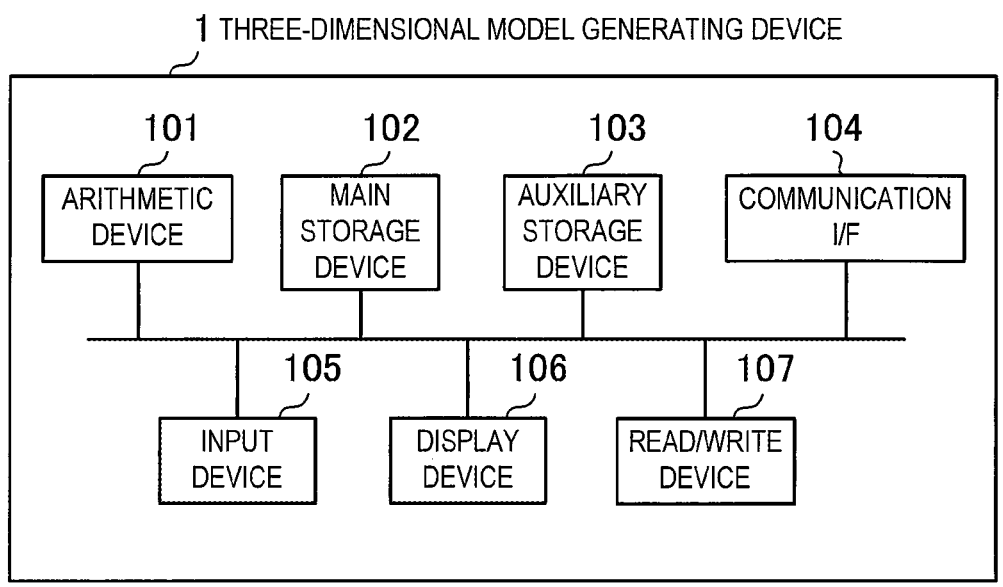
FIG. 17 is a diagram for illustrating a hardware configuration example of the three-dimensional model generating device.

FIG. 17 is a diagram for illustrating a hardware configuration example of the three-dimensional model generating device 1. The three-dimensional model generating device 1 may be implemented by, for example, a computer such as that illustrated in FIG. 17, which includes an arithmetic device 101, e.g., a central processing unit (CPU), a main storage device 102, e.g., a random-access memory (RAM), an auxiliary storage device 103, e.g., a hard disk drive (HDD), a communication interface (I/F) 104 for connecting to a communications network via a cable or wirelessly, an input device 105, e.g., a mouse, a keyboard, a touch sensor, or a touch panel, a display device 106, e.g., a liquid crystal display, and a read/write device 107 configured to read and write information from and to a portable storage medium e.g., a digital versatile disc (DVD).

The function of each unit in the three-dimensional model generating device 1 may be implemented by, for example, the arithmetic device 101 executing a predetermined program loaded in the main storage device 102 from the auxiliary storage device 103 and the like. The function of each storage unit of the three-dimensional model generating device 1 may be implemented, for example, by the arithmetic device 101 utilizing the main storage device 102 or the auxiliary storage device 103.

The above-mentioned predetermined program may be, for example, installed from a storage medium read by the read/write device 107, or installed from a network via the communication I/F 104.

Thus, the input unit 11 of the three-dimensional model generating device 1 is configured to input three-dimensional point group data of the plant. The flat surface extraction unit 12 is configured to extract the flat surfaces of the plant from the three-dimensional point group data. The grouping unit 13 is configured to group the flat surfaces into flat surface groups based on the angle of the flat surfaces with respect to a reference direction, and the distance between the flat surfaces. The connection relationship extraction unit 14 is configured to extract a connection relationship between the grouped flat surface groups. The determination unit 15 is configured to determine a steel beam that the plant is constructed from based on the extracted connection relationship. As a result, the three-dimensional model generating device 1 is capable of automatically determining the steel beams included in the plant.

Further, the acquisition unit 16 is configured to acquire standard values of the determined type of steel beam from the standard value storage unit 23. The generation unit 17 is configured to generate three-dimensional CAD data of the steel beam based on the acquired standard values. As a result, the three-dimensional model generating device 1 is capable of generating accurate three-dimensional CAD data of the steel beam.

The steel beams are not limited to I-beams, L-beams, or U-beams. For example, the three-dimensional model generating device 1 is capable of determining other types of steel beams, e.g., a T-beam, by storing rule information on those other types in the rule information storage unit 22.

Further, the three-dimensional model generating device 1 may also include a comparison unit configured to compare the three-dimensional CAD data of the steel beam generated by the generation unit 17 and three-dimensional CAD data of the design-stage steel beam, and a divergence calculation unit configured to calculate, based on a comparison result by the comparison unit, a divergence between the three-dimensional CAD data of the steel beam and the three-dimensional CAD data of the design-stage steel beam. As a result, the three-dimensional model generating device 1 is capable of outputting a value indicating how much the steel beams actually used in the plant are different from the design-stage steel beams.

The three-dimensional model generating device 1 may also include a conveyance route calculation unit configured to calculate, based on the three-dimensional CAD data of the steel beam generated by the generation unit 17, a conveyance route for the steel beam in the plant. In addition, the three-dimensional model generating device 1 may include an interference detection unit configured to detect interference between the plant and the steel beam along the conveyance route calculated by the conveyance route calculation unit. As a result, the three-dimensional model generating device 1 is capable of, for example, when replacing an old steel beam in the plant with a new steel beam, determining whether or not interference occurs between the steel beam and the plant during conveyance of the steel beam.

Further, the input unit 11 may be configured to input three-dimensional point group data measured at a plurality of locations in the plant. In addition, the generation unit 17 may be configured to generate three-dimensional CAD data of the steel beam at each of the locations based on the three-dimensional point group data on the plant measured at the plurality of locations, and to integrate the generated three-dimensional CAD data into a single coordinate system.

For example, the input unit 11 inputs three-dimensional point group data measured at a plurality of different locations in the plant. Further, the generation unit 17 generates, in independent coordinate systems, three-dimensional CAD data of the steel beam at each of the locations based on the three-dimensional point group data measured at the plurality of different locations, and integrates the three-dimensional CAD data generated for each coordinate system into a single shared coordinate system. As a result, the three-dimensional model generating device 1 is capable of generating three-dimensional CAD data for one plant based on three-dimensional point group data measured at a plurality of different locations in the plant.

The generation unit 17 may also be configured to generate three-dimensional CAD data of a part other than a steel beam, and to store the generated three-dimensional CAD data in the three-dimensional CAD data storage unit 24. In this case, the generation unit 17 may be configured to add attribute information on each part, and store the generated three-dimensional CAD data to which attribute information has been added in the three-dimensional CAD data storage unit 24. For example, the generation unit 17 may be configured to add attribute information, such as steel beam, pipe, or tank, to the generated three-dimensional CAD data, and to store the three-dimensional CAD data to which attribute information has been added in the three-dimensional CAD data storage unit 24.

The present invention has been described by way of embodiments. However, the functional configuration of the three-dimensional model generating device 1 is classified in accordance with main processing contents in order to facilitate understanding of the configuration of the three-dimensional model Generating device 1. The present invention is not limited to the classification methods or names of the components. The configuration of the three-dimensional model generating device 1 can also be classified into more components in accordance with the processing contents. Further, the classification maybe performed so that one component executes more kinds of processing. In addition, the processing performed by each component may be executed by one piece of hardware, or a plurality of pieces of hardware.

Further, each processing unit of the flowcharts described above is classified in accordance with main processing contents in order to facilitate understanding of the processing of the three-dimensional model generating device 1. The present invention is not limited to the division methods or names of the processing units. The processing of the three-dimensional model generating device 1 may also be divided into more processing units in accordance with the processing contents. In addition, one processing unit may be divided so as to include more processes.

Further, the technical scope of the present invention is not limited to the scope of descriptions of the above-mentioned embodiment. It is evident to those skilled in the art that various modifications and improvements can be added to the above-mentioned embodiment. It is also evident from the description of the appended claims that the embodiment added with such modifications and improvements can also be included in the technical scope of the present invention. Still further, the present invention may also be provided as a method of determining a structural member by the three-dimensional model generating device 1, a program for implementing a method of determining a structural member by the three-dimensional model generating device 1, and a storage medium having the program stored thereon.

What is claimed is:

1. A three-dimensional model generating device, comprising:
   at least one memory; and
   at least one processor, wherein the processor is comprised of
   an input unit configured to input three-dimensional point group data of a structure;
   a flat surface extraction unit configured to extract flat surfaces of the structure based on the three-dimensional point group data;
   a grouping unit configured to group the flat surfaces into flat surface groups based on an angle of each of the flat surfaces with respect to a reference direction and a distance between the flat surfaces;
   a connection relationship extraction unit configured to extract a connection relationship between the grouped flat surface groups;
   a rule information storage unit configured to associate and store the connection relationship and a type of a structural member;
   a determination unit configured to determine the structural member that the structure is constructed from based on the extracted connection relationship,
      wherein the determination unit is configured to refer to the rule information storage unit and to determine the structural member based on the extracted connection relationship and to determine the type of the structural member;
   an acquisition unit configured to acquire standard values of the determined type of the structural member;
   a generation unit configured to generate three-dimensional CAD data of the structural member based on the acquired standard values;
   a comparison unit configured to compare the three-dimensional CAD data generated by the generation unit and design three-dimensional CAD data from a design stage; and
   a divergence calculation unit configured to calculate, based on a comparison result, a divergence between the three-dimensional CAD data and the design three-dimensional CAD data from the design stage.

2. A three-dimensional model generating device according to claim 1, wherein the structural member comprises a steel beam.

3. A three-dimensional model generating device according to claim 1, wherein the grouping unit is configured to group the flat surfaces into groups for each predetermined angle, and to further group the flat surfaces grouped based on the predetermined angles into groups of flat surfaces that are within a predetermined distance.

4. A three-dimensional model generating device according to claim 1, wherein the connection relationship extraction unit is configured to extract the connection relationship of whether one of the flat surface groups is connected to another of the flat surface groups at an endpoint or at a midpoint.

5. A three-dimensional model generating device according to claim 1, further comprising:
   a conveyance route calculation unit configured to calculate, based on the three-dimensional CAD data of the structural member generated by the generation unit, a conveyance route for the structural member in the structure; and
   an interference detection unit configured to detect interference between the structure and the structural member along the conveyance route.

6. A three-dimensional model generating device according to claim 1,
   wherein the input unit is configured to input the three-dimensional point group data at a plurality of locations in the structure, and
   wherein the generation unit is configured to integrate three-dimensional CAD data of the structural member generated based on the three-dimensional point group data at the plurality of locations in the structure into a single coordinate system.

7. A method of determining a structural member, the method comprising:

inputting, by an arithmetic device, three-dimensional point group data of a structure;

extracting, by the arithmetic device, flat surfaces of the structure based on the three-dimensional point group data;

grouping, by the arithmetic device, the flat surfaces into flat surface groups based on an angle of each of the flat surfaces with respect to a reference direction and a distance between the flat surfaces;

extracting, by the arithmetic device, a connection relationship between the grouped flat surface groups;

associating and storing, by the arithmetic device, the connection relationship and a type of a structural member;

determining, by the arithmetic device, the structural member that the structure is constructed from based on the extracted connection relationship by referring to the connection relationship and the type of the structural member, and determining the structural member based on the extracted connection relationship and determining the type of structural member;

acquiring, by the arithmetic device, standard values of the determined type of the structural member;

generating, by the arithmetic device, three-dimensional CAD data of the structural member based on the acquired standard values comparing, by the arithmetic device, the three-dimensional CAD data generated and designing three-dimensional CAD data from a design stage; and calculating, by the arithmetic device, based on a comparison result, a divergence between the three-dimensional CAD data and the design three-dimensional CAD data from the design stage.

8. A program for causing a computer to execute:

inputting three-dimensional point group data of a structure;

extracting flat surfaces of the structure based on the three-dimensional point group data;

grouping the flat surfaces into flat surface groups based on an angle of each of the flat surfaces with respect to a reference direction and a distance between the flat surfaces;

extracting a connection relationship between the grouped flat surface groups;

associating and storing the connection relationship and a type of a structural member;

determining the structural member that the structure is constructed from based on the extracted connection relationship by referring to the connection relationship and the type of the structural member, and determining the structural member based on the extracted connection relationship and determining the type of structural member;

acquiring standard values of the determined type of the structural member;

generating three-dimensional CAD data of the structural member based on the acquired standard values comparing the three-dimensional CAD data generated and designing three-dimensional CAD data from a design stage; and calculating, based on a comparison result, a divergence between the three-dimensional CAD data and the design three-dimensional CAD data from the design stage.

* * * * *